United States Patent
Morris et al.

(10) Patent No.: US 9,497,061 B2
(45) Date of Patent: Nov. 15, 2016

(54) UNDERSAMPLED RECEIVER CHARACTERIZATION

(71) Applicant: Telefonaktiebolaget L M Ericsson (publ), Stockholm (SE)

(72) Inventors: Bradley John Morris, Ottawa (CA); Somsack Sychaleun, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 206 days.

(21) Appl. No.: 13/754,263

(22) Filed: Jan. 30, 2013

(65) Prior Publication Data
US 2014/0213206 A1    Jul. 31, 2014

(51) Int. Cl.
| H04L 27/36 | (2006.01) |
| H03F 1/32 | (2006.01) |
| H03F 3/24 | (2006.01) |
| H04L 27/26 | (2006.01) |
| H04L 5/00 | (2006.01) |
| H04L 25/02 | (2006.01) |

(52) U.S. Cl.
CPC .......... *H04L 27/368* (2013.01); *H03F 1/3247* (2013.01); *H03F 3/24* (2013.01); *H04L 27/2613* (2013.01); *H03F 2200/204* (2013.01); *H04L 5/0048* (2013.01); *H04L 25/0202* (2013.01)

(58) Field of Classification Search
None
See application file for complete search history.

(56) References Cited

U.S. PATENT DOCUMENTS

| 6,342,810 | B1* | 1/2002 | Wright et al. | 330/51 |
| 7,580,686 | B2 | 8/2009 | Fonden et al. | |
| 2003/0207680 | A1* | 11/2003 | Yang et al. | 455/341 |
| 2005/0242876 | A1 | 11/2005 | Obernosterer | |
| 2006/0109920 | A1* | 5/2006 | Sato | 375/260 |
| 2010/0098191 | A1 | 4/2010 | Morris et al. | |
| 2011/0135034 | A1 | 6/2011 | Mujica et al. | |
| 2012/0154038 | A1 | 6/2012 | Kim et al. | |

FOREIGN PATENT DOCUMENTS

EP    1267540 A1    12/2002

OTHER PUBLICATIONS

Kester, Analog Device MT-002, 2009 http://www.analog.com/static/imported-files/tutorials/MT-002.pdf.*

(Continued)

*Primary Examiner* — Ping Hsieh
*Assistant Examiner* — James Yang
(74) *Attorney, Agent, or Firm* — Withrow & Terranova, PLLC

(57) ABSTRACT

Systems and methods for characterizing an undersampled receiver generally comprise, in one embodiment, providing one or more probe signals to an input of an undersampled receiver. Each of the one or more probe signals has selective frequency components that ensure that aliases in a corresponding output signal of the undersampled receiver are unique. The undersampled receiver is then characterized based on the output signal(s) of the undersampled receiver. The selective frequency components of the one or more probe signals enable un-aliasing of the one or more output signals of the undersampled receiver and, as such, the undersampled receiver can be characterized.

17 Claims, 13 Drawing Sheets

(56) References Cited

OTHER PUBLICATIONS

Agilent, Agilent Option 1DN-1DQ product notes, 2000 http://cp.literature.agilent.com/litweb/pdf/5966-1650E.pdf.*
NI, OFDM and Multi-Channel, NI, 2014 http://www.ni.com/white-paper/3740/en/.*
Extended European Search Report for European Patent Application No. 14000237.9, mailed Apr. 12, 2016, 3 pages.

* cited by examiner

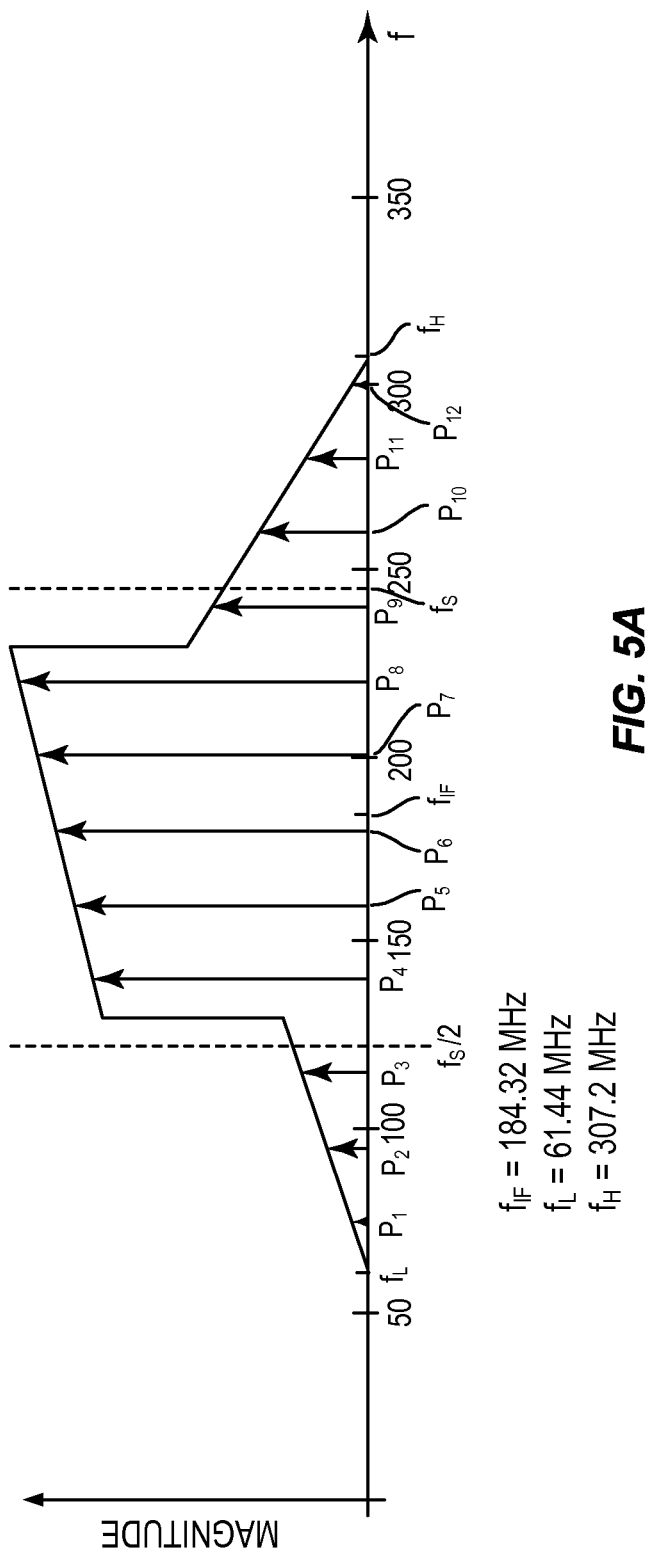

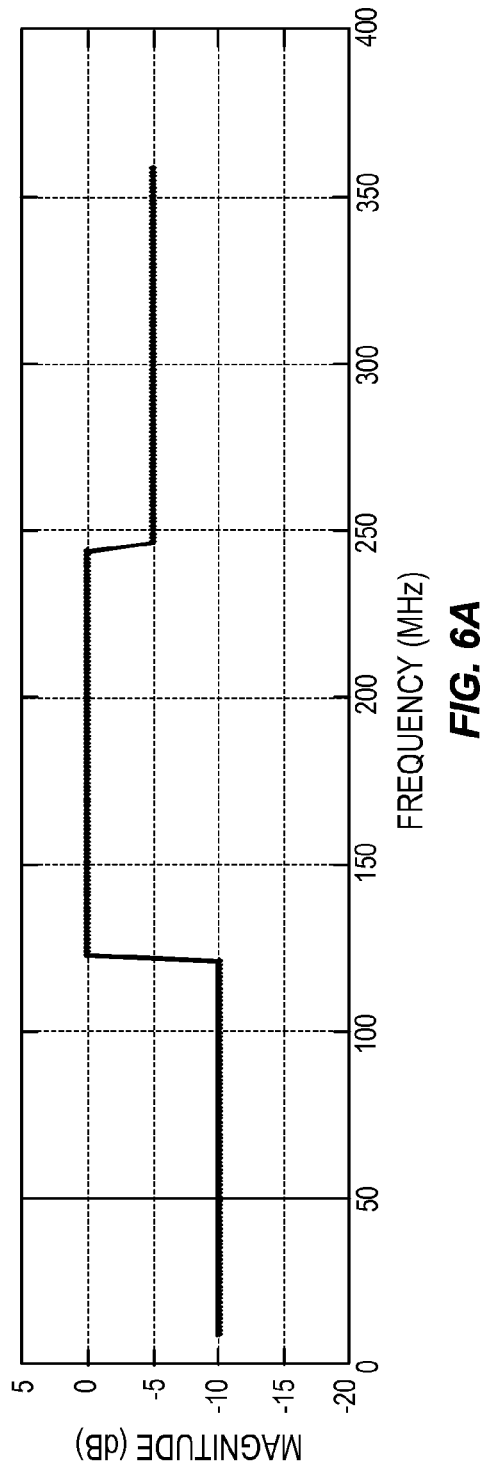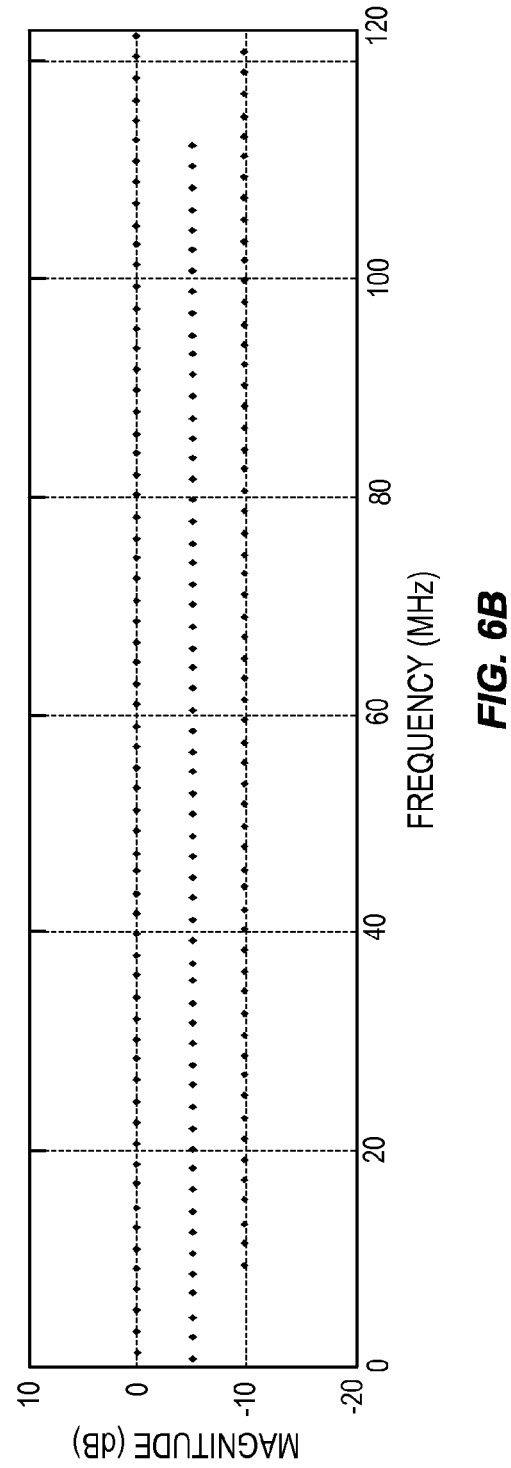

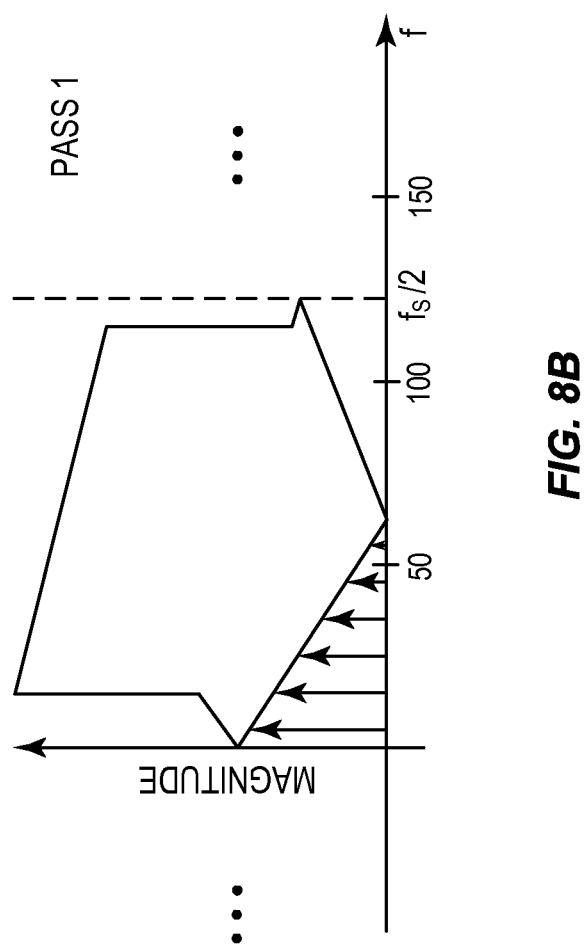

UNDERSAMPLED RECEIVER CHARACTERIZATION

FIELD OF THE DISCLOSURE

The present disclosure relates to an undersampled receiver and more particularly relates to characterization of an undersampled receiver.

BACKGROUND

An undersampled receiver generally includes a downconversion subsystem that downconverts a radio frequency signal to a desired intermediate frequency. The resulting intermediate frequency signal is then undersampled by an analog-to-digital (A/D) converter. The undersampled receiver exploits aliasing in the sampling process to enable a lower sample rate of the A/D converter. One example of an undersampled receiver is disclosed in commonly owned and assigned U.S. Pat. No. 7,580,686, entitled ADAPTIVE PREDISTORTION METHOD AND ARRANGEMENT, which issued Aug. 25, 2009. Specifically, U.S. Pat. No. 7,580,686 discloses an undersampled Transmit Observation Receiver (TOR) as part of a power amplifier linearization architecture. An input signal of the transmitter is undersampled in the same manner as the undersampled TOR output to allow a direct comparison between the undersampled input signal of the transmitter and the undersampled TOR output to drive adaptation of predistortion in the transmitter to compensate for the nonlinearity of the power amplifier.

One issue with an undersampled receiver is that the undersampled receiver cannot be easily characterized across the entire input bandwidth of the undersampled receiver, particularly for wideband signals. More specifically, if the input bandwidth of the undersampled receiver spans multiple Nyquist zones of an A/D converter of the undersampled receiver, then images of the undersampled signal will overlap. As a result, multiple frequencies of an input signal of the undersampled receiver may alias into the same frequency in an output signal of the undersampled receiver. Due to this aliasing, the undersampled receiver is not easily characterized across the entire input bandwidth.

SUMMARY

Systems and methods for characterizing an undersampled receiver are disclosed. In one embodiment, one or more probe signals are provided to an input of an undersampled receiver. Each of the one or more probe signals has selective frequency components that ensure that aliases in a corresponding output signal of the undersampled receiver are unique. The undersampled receiver is then characterized based on the output signal(s) of the undersampled receiver. The selective frequency components of the one or more probe signals enable un-aliasing of the one or more output signals of the undersampled receiver and, as such, the undersampled receiver can be characterized.

In one embodiment, each of the one or more probe signals is a multi-subcarrier signal having selective subcarriers that are selected from a set of all possible subcarriers of the multi-subcarrier signal such that aliases in the corresponding output signal of the undersampled receiver are unique. The selective subcarriers may be modulated using a desired modulation scheme (e.g., Quadrature Phase Shift Keying (QPSK)). In another embodiment, each of the one or more probe signals is a multi-tone signal having selective tones that are selected from a set of all possible tones of the multi-tone signal such that aliases in the corresponding output signal of the undersampled receiver are unique. The selective tones may be modulated using a desired modulation scheme (e.g., QPSK).

In one embodiment, the one or more probe signals are a single probe signal. The single probe signal has selective frequency components that span an entire bandwidth of a receive band of the undersampled receiver for which characterization is desired. The bandwidth of the receive band is also referred to herein as an input bandwidth of the undersampled receiver. Further, the selective frequency components of the single probe signal are selected such that aliases in a single output signal of the undersampled receiver in response to the single probe signal are unique.

In another embodiment, the one or more probe signals are multiple probe signals successively provided to the input of the undersampled receiver. Each of the probe signals has selective frequency components in a different portion of a receive band of the undersampled receiver. Further, in one embodiment, each of the probe signals has selective frequency components in a different portion of the receive band of the undersampled receiver that corresponds to a different Nyquist zone of an analog-to-digital (A/D) converter of the undersampled receiver.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates a system that includes a transmitter and an undersampled Transmit Observation Receiver (TOR) according to one embodiment of the present disclosure;

FIGS. 2A and 2B graphically illustrate aliasing into an output of the undersampled TOR for one exemplary input of the undersampled TOR;

Figure 1:
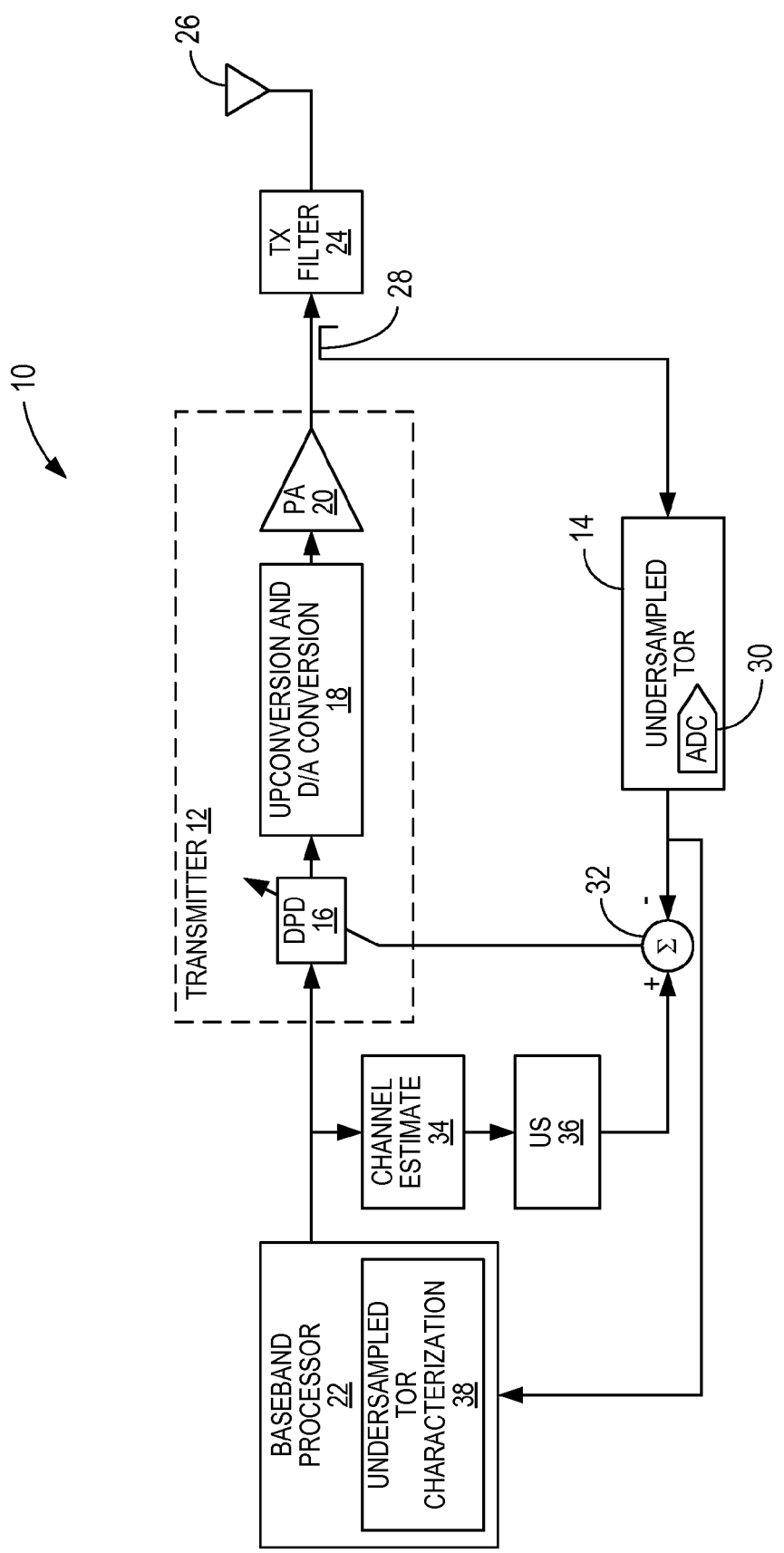
Figure 4:
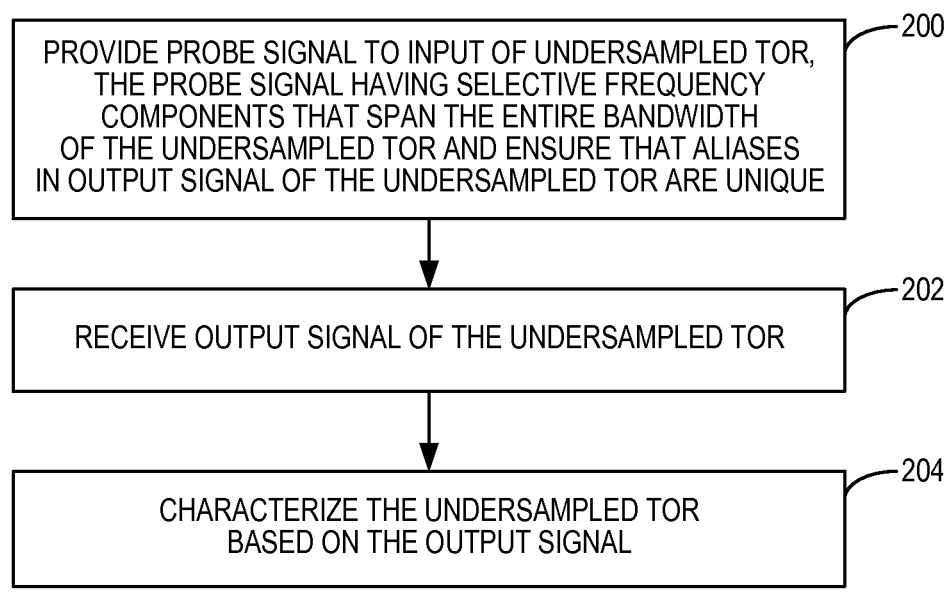
FIG. 4 illustrates a process for characterizing the undersampled TOR of FIG. 1 in a single pass according to one embodiment of the present disclosure.
Figure 5B:
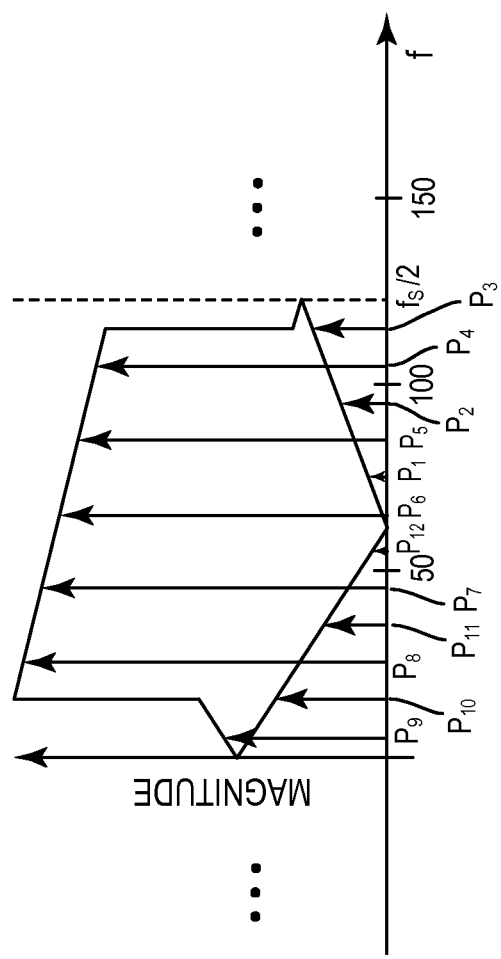
Figure 7:
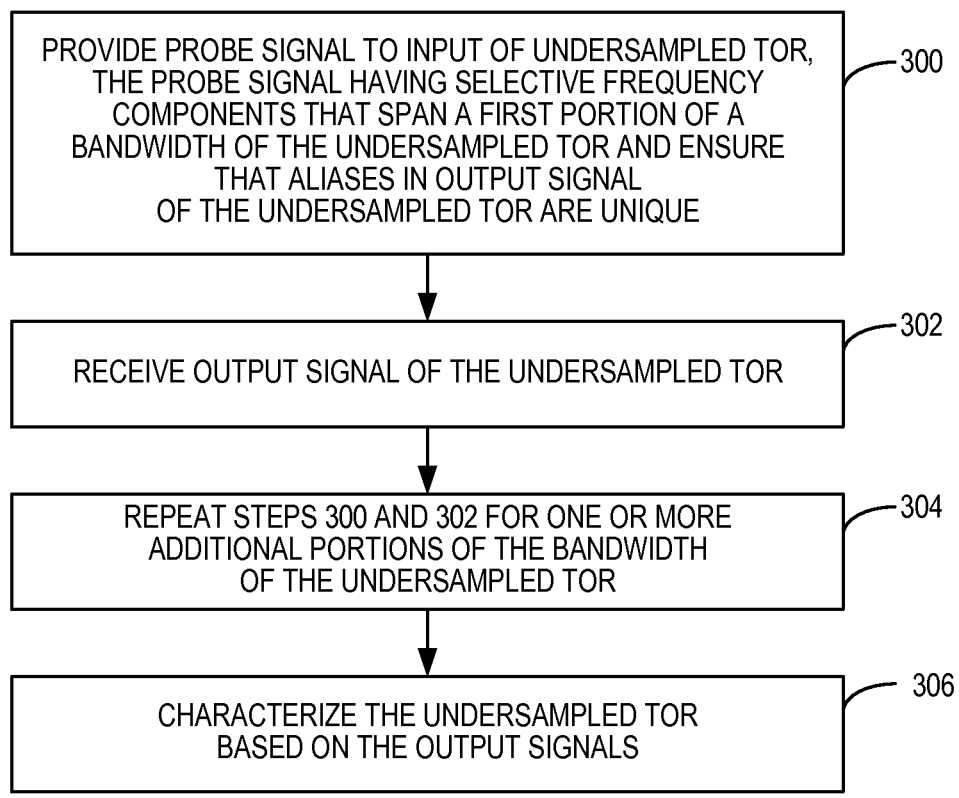

FIGS. 5A and 5B graphically illustrate one example of a probe signal input to the undersampled TOR having selective frequency components that enable unique aliases in the output signal of the undersampled TOR according to the process of FIG. 4;

FIGS. 6A and 6B graphically illustrate another example of a probe signal input to the undersampled TOR having selective frequency components that enable unique aliases in the output signal of the undersampled TOR according to the process of FIG. 4;

FIG. 7 illustrates a process for characterizing the undersampled TOR of FIG. 1 in multiple passes according to another embodiment of the present disclosure; and FIGS. 8A through 8D graphically illustrate one example of successive probe signals input to the undersampled TOR each having selective frequency components that enable unique aliases in the output signal of the undersampled TOR according to the process of FIG. 7.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to characterizing an undersampled receiver. As used herein, an undersampled receiver is a receiver having a sampling rate that is less than two times a highest frequency of an input signal of the undersampled receiver. In the discussion below, the undersampled receiver is an undersampled Transmit Observation Receiver (TOR). However, the present disclosure is not limited to an undersampled TOR. Rather, the concepts described herein are applicable to any type of undersampled receiver.

FIG. 1 illustrates a system 10 that includes a transmitter 12 and an undersampled TOR 14 according to one embodiment of the present disclosure. The transmitter 12 includes a Digital Predistortion (DPD) subsystem 16, an upconversion and Digital-to-Analog (D/A) conversion subsystem 18, and a power amplifier (PA) 20 connected as shown. In operation, a baseband processor 22 provides a digital transmit signal to an input of the transmitter 12. The digital transmit signal is predistorted by the DPD subsystem 16 to provide a predistorted transmit signal. The DPD subsystem 16 is adaptively configured to compensate for a nonlinearity of the transmitter 12 and, in particular, a nonlinearity of the PA 20. More specifically, the DPD subsystem 16 is configured such that InterModulation Distortion (IMD) resulting from the nonlinearity of the transmitter 12 that falls within a desired transmit band (i.e., a pass-band of a transmit (TX) filter 24) is minimized or at least substantially reduced.

The predistorted transmit signal output by the DPD subsystem 16 is upconverted and digital-to-analog converted by the upconversion and D/A conversion subsystem 18. Notably, while not illustrated, the upconversion and D/A conversion subsystem 18 may include additional gain and/or filtering stages. The output of the upconversion and D/A conversion subsystem 18 is then amplified by the PA 20 to provide a radio frequency transmit signal at an output of the transmitter 12. The radio frequency transmit signal is filtered by the TX filter 24 to remove undesired frequency components (e.g., undesired IMD) that fall outside of the desired transmit band. The filtered radio frequency transmit signal is then transmitted via an antenna 26.

In this embodiment, the system 10 includes a feedback path including the undersampled TOR 14 that is utilized to adaptively configure the DPD subsystem 16. In particular, a coupler 28 couples the output of the transmitter 12 to an input of the undersampled TOR 14. The undersampled TOR 14 downconverts the radio frequency transmit signal output by the transmitter 12 to a desired intermediate frequency and then, using an Analog-to-Digital Converter (ADC) 30, samples the downconverted signal at a desired undersampling rate to provide a digital TOR output signal. Notably, the term "undersampling rate" is used herein to refer to a sampling rate that is less than the Nyquist sampling rate (i.e., the undersampling rate is a sampling rate that is less than 2 times a highest frequency of the sampled signal). It should also be noted that while in this example the radio frequency transmit signal is downconverted to a desired intermediate frequency prior to analog-to-digital (A/D) conversion, the present disclosure is not limited thereto. In an alternative embodiment, there may be no downconversion prior to A/D conversion where undersampling is utilized to perform both downconversion and undersampling.

The digital TOR output signal is provided to a first input of a subtractor 32. An adjusted version of the digital transmit signal is provided to a second input of the subtractor 32. The adjusted version of the digital transmit signal is provided by passing the digital transmit signal through a channel estimate function 34 that is a model of a channel from the output of the transmitter 12 to the output of the undersampled TOR 14 and an undersampling (US) function 36 that has the same undersampling rate as the undersampled TOR 14. The subtractor 32 outputs an error signal that is equal to a difference between the adjusted version of the digital transmit signal and the digital TOR output signal. The DPD subsystem 16 is calibrated based on the error signal. In particular, the DPD subsystem 16 is adaptively configured to minimize, or at least substantially reduce, the error signal.

As discussed below in detail, in order to calibrate the channel estimate function 34, the system 10 operates in a characterization mode in which one or more probe signals are transmitted via the transmitter 12 and received by the undersampled TOR 14. In one particular embodiment, the transmitter 12 is a digital transmitter as disclosed in U.S. Patent Application Publication No. 2010/0098191, entitled METHODS AND SYSTEMS FOR PROGRAMMABLE DIGITAL UP-CONVERSION, which published Apr. 22, 2010, which is incorporated herein for its teachings related to a digital transmitter. Note, however, that while in the embodiment of FIG. 1 the probe signal(s) are provided internally via the transmitter 12, the present disclosure is not limited thereto. In an alternative embodiment, the probe signal(s) is(are) provided by an external device or system (e.g., an arbitrary waveform generator such as those manufactured and sold by Agilent) that is connected to the input of the undersampled TOR 14 during characterization.

Each of the one or more probe signals is such that all aliases in the corresponding digital TOR output signal in response to the probe signal are unique. As a result, an undersampled TOR characterization function 38 of the baseband processor 22 is enabled to "un-alias" the digital TOR output signal(s) output by the undersampled TOR 14 in response to the probe signal(s). Using the un-aliased digital TOR output signal(s), the undersampled TOR characterization function 38 is enabled to characterize the undersampled TOR 14 across an entire input bandwidth of the undersampled TOR 14. Preferably, characterizing the undersampled TOR 14 includes estimating a frequency response (e.g., amplitude and phase) of the undersampled TOR 14 across the entire input bandwidth of the undersampled TOR 14.

Figure 2A:
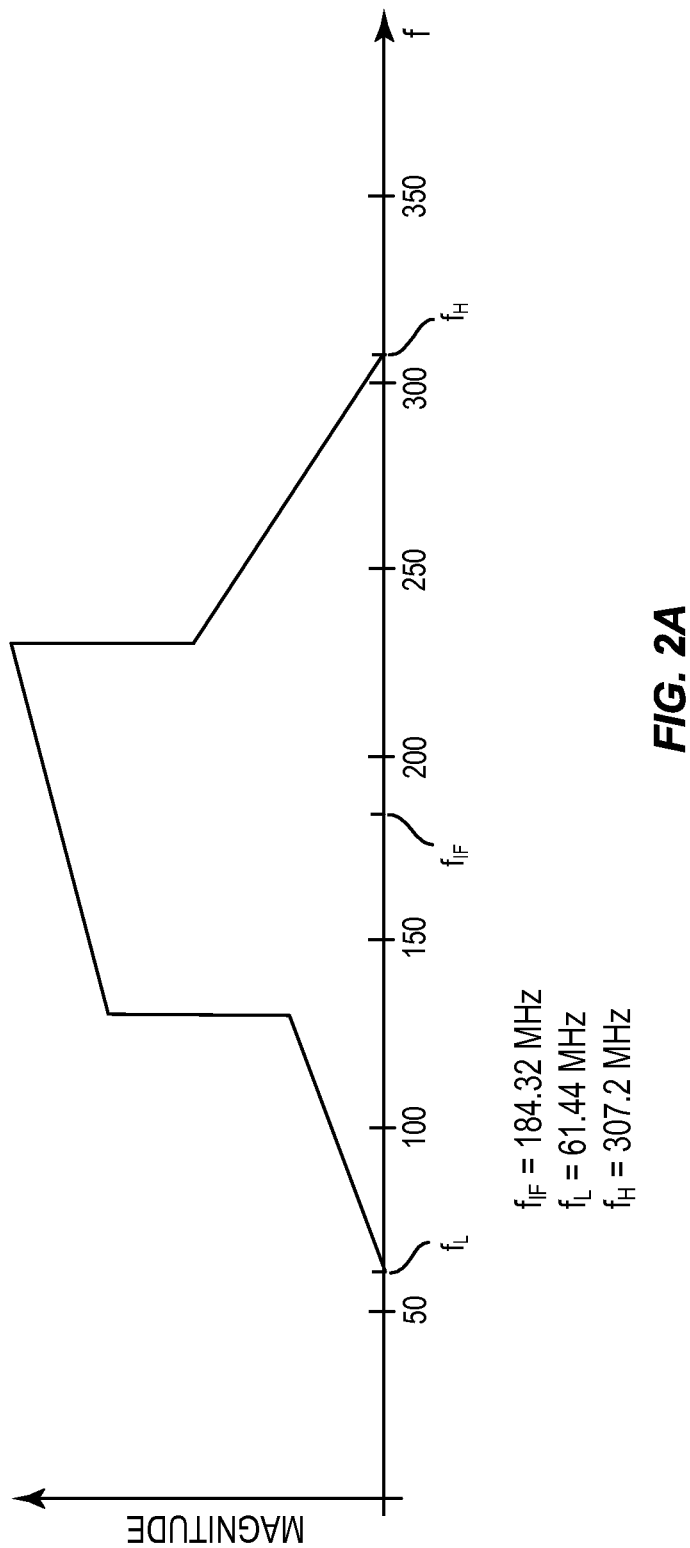
Figure 2B:
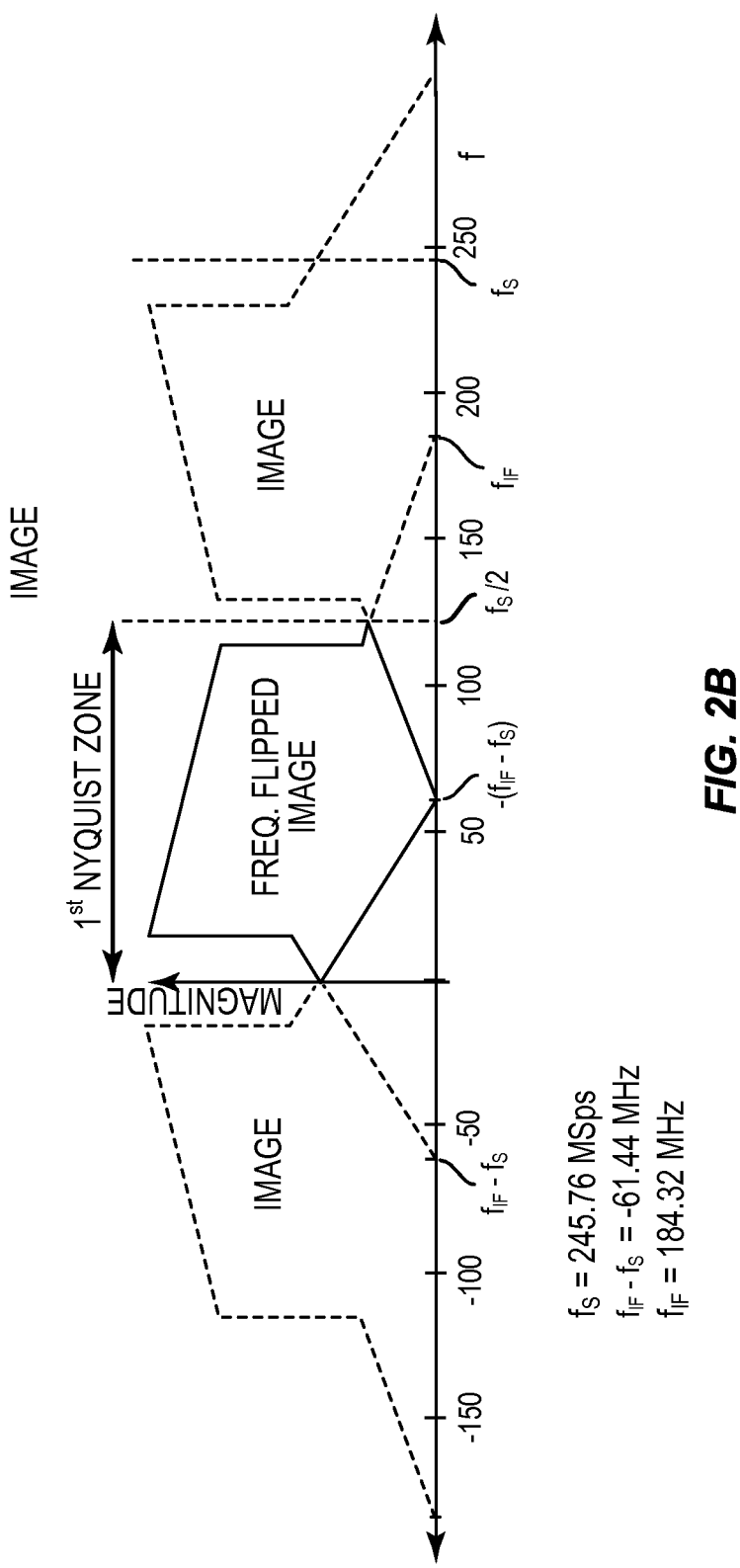

Before discussing characterization of the undersampled TOR 14 in detail, a brief discussion of aliasing that results from the undersampling performed by the undersampled TOR 14 is beneficial. In this regard, FIGS. 2A and 2B are frequency domain illustrations of an exemplary analog input signal to the ADC 30 of the undersampled TOR 14 and the resulting digital output signal output by the ADC 30 of the undersampled TOR 14. More specifically, as illustrated in FIG. 2A, the analog input signal of the ADC 30 is centered at an intermediate frequency ($f_{IF}$) and spans a frequency range from a lower frequency ($f_L$) to a higher frequency ($f_H$).

In this example, $f_{IF}$ is equal to 184.32 megahertz (MHz), $f_L$ is equal to 61.44 MHz, and $f_H$ is equal to 307.2 MHz. As such, the bandwidth of the analog input signal is 245.76 MHz.

In this example, an undersampling rate ($f_S$) of the ADC 30 is 245.76 Mega Samples per second (MSps). As such, as illustrated in FIG. 2B, images of the analog input signal are centered at $(f_{IF}-f_S)+i*f_S$, where i= . . . , −2, −1, 0, 1, 2, . . . . Thus, in this example, two of the images are located at −61.44 MHz and 184.32 MHz, as illustrated in FIG. 2B. Similarly, frequency-flipped images of the analog input signal are centered at 61.44 MHz+$i*f_S$, where again i= . . . , −2, −1, 0, 1, 2, . . . . FIG. 2B illustrates the frequency-flipped image of the analog input signal located at 61.44 MHz. In this example, the digital output signal of the ADC 30 is a digital representation of the signal in a first Nyquist zone of the ADC 30, where the first Nyquist zone is the frequency range of 0 to $f_S/2$. However, as illustrated in FIG. 2B, there is aliasing of the images centered at −61.44 MHz and 184.32 MHz into the first Nyquist zone. As a result of this aliasing, the undersampled TOR 14 cannot be characterized using traditional characterization techniques. Specifically, traditional characterization techniques are unable to un-alias the digital TOR output signal because, traditionally, at least some frequency components of the digital TOR output signal include contributions from different Nyquist zones.

Figure 3:
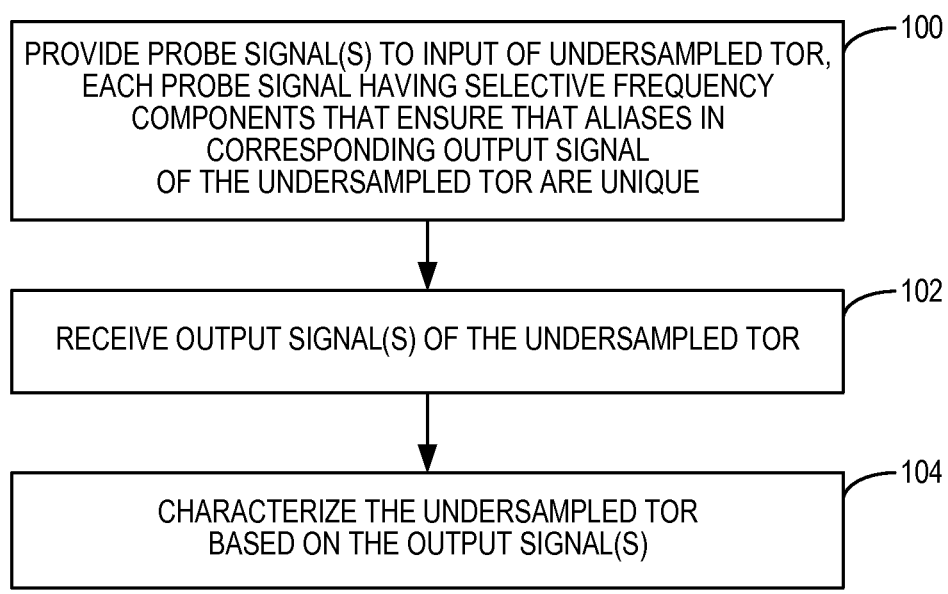
FIG. 3 illustrates a process for characterizing the undersampled TOR of FIG. 1 according to one embodiment of the present disclosure.

FIG. 3 illustrates a process for characterizing the undersampled TOR 14 of FIG. 1 according to one embodiment of the present disclosure. In order to characterize the undersampled TOR 14, one or more probe signals are provided to the input of the undersampled TOR 14 (step 100). Each probe signal of the one or more probe signals has selective frequency components that ensure that aliases in the corresponding digital TOR output signal are unique. In one embodiment, each probe signal is an Orthogonal Frequency Division Multiplexing (OFDM) or OFDM-like signal having multiple carrier frequencies or multiple frequency tones. However, the probe signals are not limited thereto and may alternatively be time domain signals designed to have multiple separate and distinct frequency components. Further, each selective frequency component may or may not be modulated. For example, each subcarrier or frequency tone may be modulated using a Quadrature Phase Shift Keying (QPSK) modulation scheme.

For each probe signal, the frequency components of the one or more probe signals are selected such that all aliases of the frequency components of the probe signal are at unique frequencies. In other words, the frequency components of the probe signal are selected such that no two aliases are at the same frequency. As discussed below in detail, in one embodiment, a single probe signal is provided to the input of the undersampled TOR 14, where the single probe signal has selective frequency components that span the entire input bandwidth of the undersampled TOR 14 and ensure that aliases in the digital TOR output signal are unique. In another embodiment, multiple probe signals are successively provided to the input of the undersampled TOR 14 where each of the probe signals has selective frequency components that span a different portion of the input bandwidth of the undersampled TOR 14 and ensure that aliases in the digital TOR output signal are unique.

As discussed above, in one particular embodiment, the transmitter 12 is a digital transmitter such as, for example, the digital transmitter disclosed in U.S. Patent Application Publication No. 2010/0098191, and the transmitter 12 generates the one or more probe signals. In this case, due to the digital nature of the signal synthesis of the one or more probe signals and the undersampled TOR output signal, spacing of selective frequency components of the one or more probe signals is essentially arbitrary. As such, any desired resolution can be achieved. Note, however, that the selective frequency components of each probe signal are still selected such that all aliases in the corresponding output signal of the undersampled TOR 14 in response to the probe signal are unique.

One or more digital TOR output signals are received from the output of the undersampled TOR 14 in response to the one or more probe signals (step 102). The undersampled TOR 14 is then characterized based on the one or more digital TOR output signals (step 104). The undersampled TOR 14 can be characterized by comparing the one or more digital TOR output signals with the one or more probe signals. More specifically, for each probe signal, all aliases in the corresponding digital TOR output signal are unique. As such, each digital TOR output signal can be un-aliased such that the contribution of each frequency component of the corresponding probe signal in the digital TOR output signal can be determined. After the un-aliasing, the one or more digital TOR output signals can be compared to the corresponding one or more probe signals to characterize the undersampled TOR 14. In one embodiment, characterization of the undersampled TOR 14 includes determining a frequency response of the undersampled TOR 14 across the entire input bandwidth of the undersampled TOR 14.

FIG. 4 illustrates a process for characterizing the undersampled TOR 14 of FIG. 1 according to another embodiment of the present disclosure. This embodiment is similar to that of FIG. 3 but where a single probe signal having selective frequency components that span the entire input bandwidth of the undersampled TOR 14 is utilized for characterization. More specifically, first, a probe signal is provided to the input of the undersampled TOR 14 (step 200). The probe signal has selective frequency components that span the entire input bandwidth of the undersampled TOR 14 and ensure that aliases in the digital TOR output signal are unique. In one embodiment, the probe signal is an OFDM or OFDM-like signal having multiple carrier frequencies or multiple frequency tones that are selected such that aliases in the digital TOR output signal are unique. However, the probe signal is not limited thereto and may alternatively be time domain signal designed to have multiple separate and distinct frequency components that are selected such that aliases in the digital TOR output signal are unique. Further, each selective frequency component may or may not be modulated. For example, each subcarrier or frequency tone may be modulated using a QPSK modulation scheme.

Next, a digital TOR output signal is received from the output of the undersampled TOR 14 in response to the probe signal (step 202). The undersampled TOR 14 is then characterized based on the digital TOR output signal (step 204). More specifically, since the aliases in the digital TOR output signal are unique, the digital TOR output signal can be un-aliased such that the contribution of each frequency component of the probe signal in the digital TOR output signal can be determined. In one embodiment, characterization of the undersampled TOR 14 includes determining a frequency response of the undersampled TOR 14 across the entire input bandwidth of the undersampled TOR 14.

FIGS. 5A and 5B graphically illustrate one example of the selection of the frequency components of the probe signal of FIG. 4 such that aliases in the digital TOR output signal are unique. More specifically, FIG. 5A is a frequency domain illustration of the probe signal after downconversion to a desired intermediate frequency. The resulting intermediate frequency probe signal illustrated in FIG. 5A is provided to the input of the ADC 30 of the undersampled TOR 14. As illustrated, the intermediate frequency probe signal includes selective frequency components indicated as $P_1$ through $P_{12}$ that span the entire input bandwidth of the undersampled TOR 14. Note that while only twelve selective frequency components are illustrated in this example for clarity and ease of discussion, the probe signal, and thus the intermediate frequency probe signal, may have many more frequency components (e.g., 127 or more frequency components). As illustrated in FIG. 5B, the selective frequency components $P_1$ through $P_{12}$ are selected such that aliases of the selective frequency components $P_1$ through $P_{12}$ are unique in the digital TOR output signal.

FIGS. 6A and 6B illustrate another example of the selection of the frequency components of the probe signal of FIG. 4 such that aliases in the digital TOR output signal are unique. More specifically, FIG. 6A is a frequency domain illustration of the probe signal after downconversion to a desired intermediate frequency. Notably, in this example, the input bandwidth of the undersampled TOR 14, and thus the frequency span of the probe signal, is wider than in the previous example. Specifically, in this example, the input bandwidth of the undersampled TOR 14 is 350 MHz. Using the same undersampling rate, up to three aliases can be located at the same frequency in the digital TOR output signal. In other words, without careful selection of the frequency components in the probe signal, aliases in the digital TOR output signal can be non-unique. In this example, the probe signal includes 127 selective frequency components that span the entire input bandwidth of the undersampled TOR 14, which are indicated by corresponding dots in the illustration of the probe signal after downconversion to the desired intermediate frequency shown in FIG. 6A. As illustrated in FIG. 6B, the selective frequency components of the probe signal are selected such that aliases of the selective frequency components are unique in the digital TOR output signal.

FIG. 7 illustrates a process for characterizing the undersampled TOR 14 of FIG. 1 according to another embodiment of the present disclosure. This embodiment is similar to that of FIG. 3 but where multiple successive probe signals having selective frequency components that span different portions of the input bandwidth of the undersampled TOR 14 are utilized for characterization. This embodiment is referred to herein as a multi-pass embodiment. In general, the input bandwidth of the undersampled TOR 14 spans multiple ADC Nyquist zones, and the probe signals include frequency components in different Nyquist zones. Thus, in one embodiment, the number of probe signals is equal to the number of Nyquist zones spanned by the input bandwidth of the undersampled TOR 14. However, in another embodiment, the number of probe signals may be less than the number of Nyquist zones spanned by the input bandwidth of the undersampled TOR 14. For example, two probe signals may be used for an embodiment where the input bandwidth spans three Nyquist zones. For each of the two probe signals, the frequency components of the probe signal are selected such that all aliases in the corresponding digital TOR output signal are unique.

First, a probe signal that includes selective frequency components that spans a first portion of the bandwidth of receive band of the undersampled TOR 14 is provided to the input of the undersampled TOR 14 (step 300). In this embodiment, the first portion of the bandwidth of the receive band of the undersampled TOR 14 is a portion of the bandwidth of the receive band of the undersampled TOR 14 in one Nyquist zone. As a result, the selective frequency components of the probe signal ensure that aliases in the digital TOR output signal in response to the probe signal are unique. However, as noted above, in an alternative embodiment, the first portion of the bandwidth of the receive band may span more than one Nyquist zone. In one embodiment, the probe signal is an OFDM or OFDM-like signal having multiple carrier frequencies or multiple frequency tones in the first portion of the bandwidth of the receive band of the undersampled TOR 14. However, the probe signal is not limited thereto and may alternatively be a time domain signal designed to have multiple separate and distinct frequency components in the first portion of the bandwidth of the receive band of the undersampled TOR 14. Further, each selective frequency component may or may not be modulated. For example, each subcarrier or frequency tone may be modulated using a QPSK modulation scheme.

Next, a digital TOR output signal is received from the output of the undersampled TOR 14 in response to the probe signal (step 302). Steps 300 and 302 are then repeated for one or more additional probe signals that have selective frequency components for one or more different portions of the bandwidth of the receive band of the undersampled TOR 14 (step 304). The undersampled TOR 14 is then characterized based on the digital TOR output signals received in response to the probe signals (step 306). More specifically, for each probe signal, all aliases in the corresponding digital TOR output signal are unique. As such, each of the digital TOR output signals can be un-aliased such that the contribution of each frequency component of the corresponding probe signal in the digital TOR output signal can be determined. In one embodiment, characterization of the undersampled TOR 14 includes determining a frequency response of the undersampled TOR 14 across the entire input bandwidth of the undersampled TOR 14.

Figure 8A:
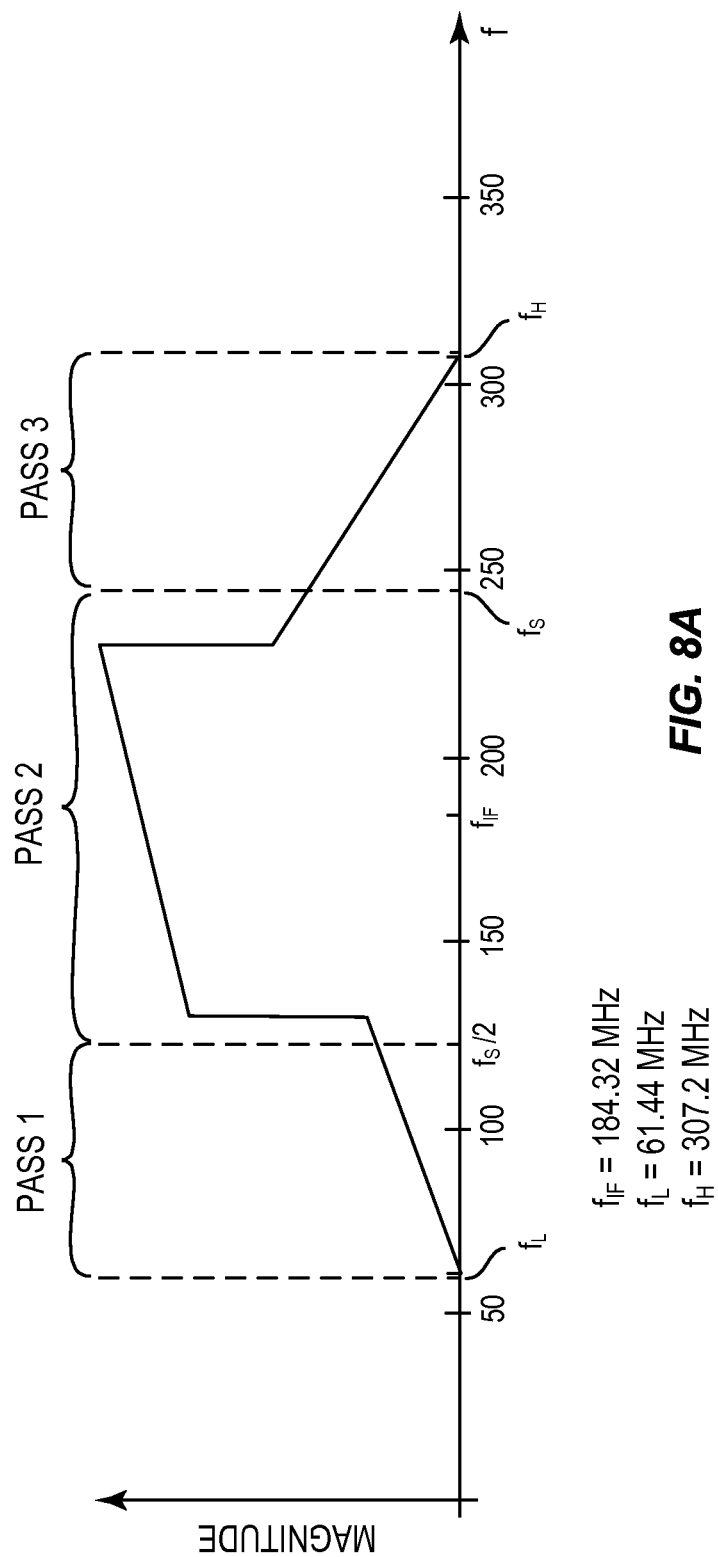

FIGS. 8A through 8D graphically illustrate one example of the probe signals of FIG. 7. More specifically, as illustrated in FIG. 8A, a bandwidth of the undersampled TOR 14 after downconversion to the desired intermediate frequency ($f_{IF}$) spans from a lower frequency ($f_L$) to a higher frequency ($f_H$). Further, the bandwidth of the undersampled TOR 14 spans three Nyquist zones, namely, a first Nyquist zone from 0 to $f_S/2$, a second Nyquist zone from $f_S/2$ to $f_S$, and a third Nyquist zone from $f_S$ to $3f_S/2$. In this example, a probe signal for a first pass includes selective frequency components that span a frequency range from $f_L$ to $f_S/2$, a probe signal for a second pass includes selective frequency components that span a frequency range from $f_S/2$ to $f_S$, and a probe signal for a third pass includes selective frequency components that span a frequency range from $f_S$ to $f_H$.

Figure 8C:
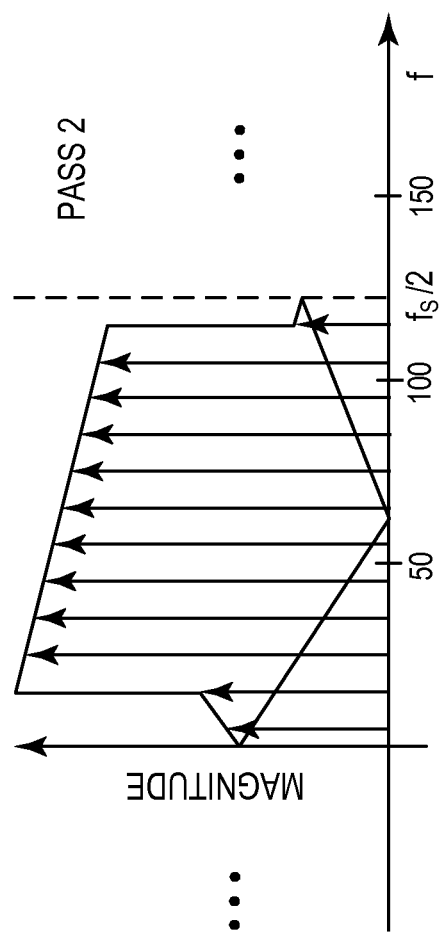
Figure 8D:
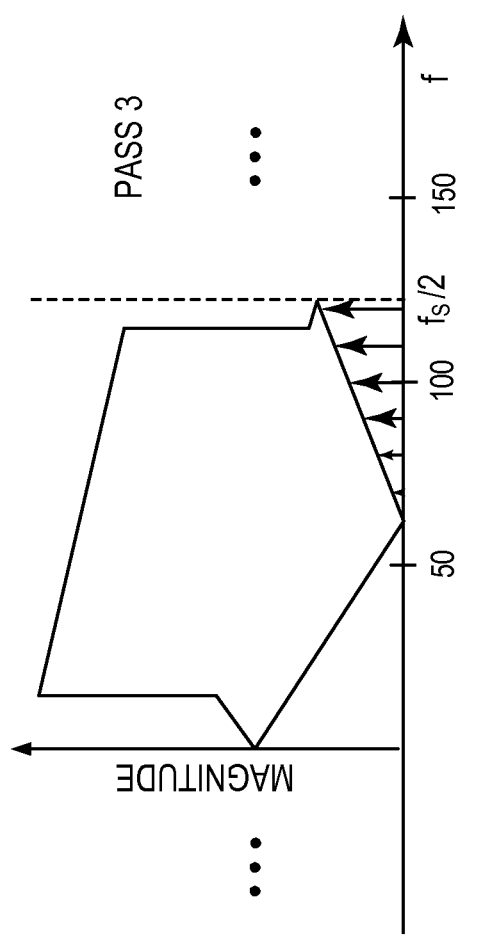

As a result, for the first pass, the digital TOR output signal received in response to the probe signal for the first pass includes unique aliases, as illustrated in FIG. 8B. More specifically, the selective frequency components for the probe signal for the first pass only span the frequency range of $f_L$ to $f_S/2$ and, as such, the probe signal does not include any selective frequency components in the other portions of the bandwidth of the undersampled TOR 14 that would have aliases that would collide with the aliases of the selective frequency components of the probe signal in the digital TOR output signal. Likewise, for the second and third passes, the corresponding digital TOR output signals received in response to the probe signals for the second and third passes include unique aliases, as illustrated in FIGS. 8C and 8D.

One advantage of the systems and methods disclosed herein is to allow characterization of an undersampled receiver even though the receiver itself results in a large amount of aliasing. The undersampled receiver is a very useful concept in wideband applications as it enables using a much lower sample rate to observe a wideband signal and consequently allows a much lower computational rate to determine DPD parameters. By combining an undersampled receiver with 'characterization,' it is possible to gain the advantages of the undersampled receiver while enabling the use of lower performance (e.g. flatness of a filter, etc.) components due to the ability to digitally compensate the reference signal.

The following acronyms are used throughout this disclosure.

A/D Analog-to-Digital
ADC Analog-to-Digital Converter
DPD Digital Predistortion
IMD Intermodulation Distortion
MHz Megahertz
MSps Mega Samples per Second
OFDM Orthogonal Frequency Division Multiplexing
PA Power Amplifier
QPSK Quadrature Phase Shift Keying
SNR Signal-to-Noise Ratio
TOR Transmit Observation Receiver
TX Transmit
US Undersampling Those skilled in the art will recognize improvements and modifications to the preferred embodiments of the present disclosure. All such improvements and modifications are considered within the scope of the concepts disclosed herein and the claims that follow.

What is claimed is:

1. A method of characterizing an undersampled receiver, comprising:
   providing one or more probe signals, from an output of a transmitter, to an input of the undersampled receiver; and
   characterizing the undersampled receiver based on one or more output signals of the undersampled receiver in response to the one or more probe signals where characterizing the undersampled receiver comprises generating a model of a channel between the input of the undersampled receiver and an output of the undersampled receiver;
   wherein each probe signal of the one or more probe signals has selective frequency components that ensure that aliases in a corresponding one of the one or more output signals of the undersampled receiver are unique.

2. The method of claim 1 wherein each probe signal of the one or more probe signals is a multi-tone signal having selective tones that are selected from a set of all possible tones of the multi-tone signal such that aliases in the corresponding one of the one or more output signals of the undersampled receiver are unique.

3. The method of claim 2 wherein the selective tones of the multi-tone signal are modulated.

4. The method of claim 1 wherein for a bandwidth of a receive band of the undersampled receiver for which characterization is desired, a corresponding bandwidth at an input of an analog-to-digital converter of the undersampled receiver spans multiple Nyquist zones of the analog-to-digital converter.

5. The method of claim 1 wherein:
   providing the one or more probe signals comprises providing a single probe signal to the input of the undersampled receiver; and
   characterizing the undersampled receiver comprises characterizing the undersampled receiver based on a single output signal of the undersampled receiver in response to the single probe signal;
   wherein the single probe signal is provided such that the single probe signal has selective frequency components that span an entire bandwidth of a receive band of the undersampled receiver for which characterization of the undersampled receiver is desired, and the selective frequency components are selected such that aliases in the single output signal are unique.

6. The method of claim 5 wherein the single probe signal is a multi-tone signal having selective tones that are selected from a set of all possible tones of the multi-tone signal such that aliases in the single output signal of the undersampled receiver in response to the single probe signal are unique.

7. The method of claim 1 wherein:
   providing the one or more probe signals to the input of the undersampled receiver comprises successively providing multiple probe signals to the input of the undersampled receiver, each probe signal of the multiple probe signals having selective frequency components in a different portion of a receive band of the undersampled receiver; and
   characterizing the undersampled receiver comprises characterizing the undersampled receiver based on multiple output signals successively output by the undersampled receiver in response to the multiple probe signals.

8. The method of claim 7 wherein the different portions of the receive band of the undersampled receiver in which the multiple probe signals have selective frequency components correspond to different Nyquist zones of an analog-to-digital converter of the undersampled receiver.

9. The method of claim 7 wherein each probe signal of the multiple probe signals is a multi-tone signal having selective tones that are selected from a set of all possible tones of the multi-tone signal such that aliases in a corresponding one of the multiple output signals of the undersampled receiver are unique.

10. The method of claim 1 wherein the undersampled receiver and the transmitter are incorporated into a communication device, and providing the one or more probe signals to the input of the undersampled receiver comprises:
   generating the one or more probe signals via the transmitter; and
   providing the one or more probe signals to the input of the undersampled receiver via a coupler that couples an output of the transmitter to the input of the undersampled receiver.

11. The method of claim 1 wherein providing the one or more probe signals to the input of the undersampled receiver comprises providing the one or more probe signals from an external signal generating device to the input of the undersampled receiver.

12. The method of claim 1 wherein characterizing the undersampled receiver comprises un-aliasing the one or more output signals.

13. The method of claim 1 further comprising utilizing one or more results characterizing the undersampled receiver to improve a performance of the undersampled receiver.

14. The method of claim 1 wherein the undersampled receiver is an undersampled transmit observation receiver coupled to an output of the transmitter, and characterizing the undersampled receiver comprises generating the model of the channel between the output of the transmitter and the output of the undersampled transmit observation receiver.

15. The method of claim 14 further comprising, during normal operation of the transmitter:
   applying the model to an input signal of the transmitter to provide a reference signal;
   undersampling the reference signal to provide an undersampled reference signal; and
   adaptively configuring digital predistortion in the transmitter based on a difference between the undersampled reference signal and the output of the undersampled transmit observation receiver.

16. A system comprising:
   an undersampled receiver;
   a transmitter for generating one or more probe signals and providing the one or more probe signals to an input of the undersampled receiver; and
   a processor for characterizing the undersampled receiver based on one or more output signals of the undersampled receiver in response to the one or more probe signals where characterizing the undersampled receiver comprises generating a model of a channel between the input of the undersampled receiver and an output of the undersampled receiver;
   wherein each probe signal of the one or more probe signals has selective frequency components that ensure that aliases in a corresponding one of the one or more output signals of the undersampled receiver are unique.

17. The system of claim 16 wherein each probe signal of the one or more probe signals is a multi-tone signal having selective tones that are selected from a set of all possible tones of the multi-tone signal such that aliases in the corresponding one of the one or more output signals of the undersampled receiver are unique.

* * * * *